United States Patent [19]

Hendriks

[11] Patent Number: 4,628,540
[45] Date of Patent: Dec. 9, 1986

[54] TUNING ARRANGEMENT HAVING A SUBSTANTIALLY CONSTANT FREQUENCY DIFFERENCE BETWEEN AN RF-CIRCUIT AND AN OSCILLATOR CIRCUIT

[75] Inventor: Johannes H. Hendriks, Eindhoven, Netherlands

[73] Assignee: U.S. Philips Corporation, New York, N.Y.

[21] Appl. No.: 715,570

[22] Filed: Mar. 25, 1985

[30] Foreign Application Priority Data

Apr. 12, 1984 [NL] Netherlands ................. 8401174

[51] Int. Cl.$^4$ ............................. H04B 1/26
[52] U.S. Cl. ..................... 455/197; 455/262; 455/264; 455/318; 331/177 V
[58] Field of Search ............ 455/195–197, 455/262, 264, 191, 318; 331/177 V; 334/15

[56] References Cited

U.S. PATENT DOCUMENTS

| | | | |
|---|---|---|---|
| 3,354,397 | 11/1967 | Wittig | 455/195 |
| 3,370,254 | 2/1968 | Keller | 331/177 V |
| 3,582,791 | 6/1971 | Slavin | 455/195 |
| 3,611,154 | 10/1971 | Kupfer | 455/197 |
| 3,889,210 | 6/1975 | Matsuura et al. | 331/177 V |

OTHER PUBLICATIONS

"Philips Data-Handbook—Components and Material", part 2, 12/82, pp. 19-35.
German Amtsblatt Nr. 69/1981.1.5.

Primary Examiner—Jin F. Ng
Attorney, Agent, or Firm—Thomas A. Briody; Jack Oisher; William J. Streeter

[57] ABSTRACT

A tuning arrangement including a mixer stage, a tunable RF-circuit coupled to an input of said mixer stage, an oscillator circuit, coupled to another input of said mixer stage, having a tunable resonant circuit and, for both circuits, a common tuning to mutually different resonant frequencies, of which at least the circuit having the higher resonant frequency includes, a parallel circuit of, on the one hand, a circuit inductance and, on the other hand, a series arrangement of a tuning capacitor and a padding capacitor. For an acceptable tracking between the resonant frequencies of the two circuits, more specifically in the lower frequency portion of the tuning range, the padding capacitor is shunted by a coil which considerably reduces the effect of the capacitance of the padding capacitor at least in the lower frequency portion of the tuning range.

3 Claims, 5 Drawing Figures

TUNING ARRANGEMENT HAVING A SUBSTANTIALLY CONSTANT FREQUENCY DIFFERENCE BETWEEN AN RF-CIRCUIT AND AN OSCILLATOR CIRCUIT

BACKGROUND OF THE INVENTION

The invention relates to a tuning arrangement comprising a tunable RF-circuit, a mixer stage coupled thereto, an oscillator circuit having a tunable resonant circuit and, for both circuits, a common tuning to mutually different resonant frequencies, of which at least the circuit having the higher resonant frequency comprises a parallel arrangement of, on the one hand, a circuit inductance and on the other hand a series arrangement of a tuning capacitor and a padding capacitor.

Such a tuning arrangement is described in "Philips Data-handbook—Components and Material", part 2, December 1982, pages 19–35, having the type designation ELC 2006.

In this known tuning arrangement, the two circuits are tuned with the aid of mutually equal, variable capacitance diodes to which the same tuning voltage is applied from the common tuning voltage input, the tuning frequency of the oscillator resonant circuit being higher than the tuning frequency of the RF-circuit, so that a variation in the tuning voltage results in a variation in the tuning frequency, which is greater for the oscillator resonant circuit than for the RF-circuit. This tuning-voltage dependent variation of the tuning frequency—alternatively referred to as the tuning slope—of the oscillator-resonant circuit is reduced by means of the padding capacitor. As a result thereof, the frequency-dependent deviation of the difference between the tuning frequencies of the two circuits is indeed reduced, but an appropriate parallel variation of these tuning frequencies is only achieved in a limited portion of the tuning range: particularly at lower tuning frequencies, said difference was found to decrease with frequency to an unwanted high degree. To prevent this, the padding capacitor can be switched to a lower capacitance value, for example, by switching a circuit capacitance in parallel with it.

SUMMARY OF THE INVENTION

The invention has for its object to provide a tuning arrangement in which a substantially constant frequency distance between the tuning frequencies of the two circuits is maintained over at least a larger portion of the tuning range than is possible in the prior art tuning arrangement without switching the padding capacitor to a different value.

According to the invention, a tuning arrangement of the type defined in the opening paragraph, is characterized in that in the last-mentioned circuit, the padding capacitor is shunted by a coil, which compensates, at least partly, the capacitance of the padding capacitor within the tuning range of this circuit, and in that the resonant frequency determined by the coil and the padding capacitor is located below the lowest tuning frequency of the relevant circuit.

When the measure according to the invention is applied, an extra degree of freedom is introduced by the coil, which, versus a decreasing tuning frequency, enables an ever growing increase in the reducing effect of the padding capacitor on the tuning slope of the relevant circuit. Thus, the decrease in the difference between the tuning frequencies of the two circuits versus a decreasing tuning frequency is greatly limited without the actual capacitance value of the padding capacitor being reduced.

A preferred embodiment of a tuning arrangement according to the invention, is characterized in that said circuit having the higher resonant frequency is the resonant circuit of the oscillator circuit and that the coil limits the tuning range of this circuit at the low frequency end.

When this measure is applied, tuning to a frequency outside the permissible tuning range—as, for example, defined in German Amtsblatt Nr. 69/1981.1.5—can be prevented.

A further preferred embodiment of a tuning arrangement according to the invention, is characterized in that the tuning range of the tuning arrangement includes at least the standardized television frequency band VHF I and the resonant frequency of the oscillator resonant circuit is an order of magnitude of 40 MHz above the resonant frequency of the RF-circuit, the padding capacitor having a capacitance of the order of magnitude of 120 pF and the coil having a value of the order of mganitude of 70 nH.

When this measure is applied, an efficient synchronous correction is obtained, at least for the overall standardized VHF I-frequency band.

DESCRIPTION OF THE DRAWINGS

The invention will now be described in greater detail by way of example, with reference to the accompanying drawings.

Therein.

DESCRIPTION OF THE PREFERRED EMBODIMENT

Figure 1:
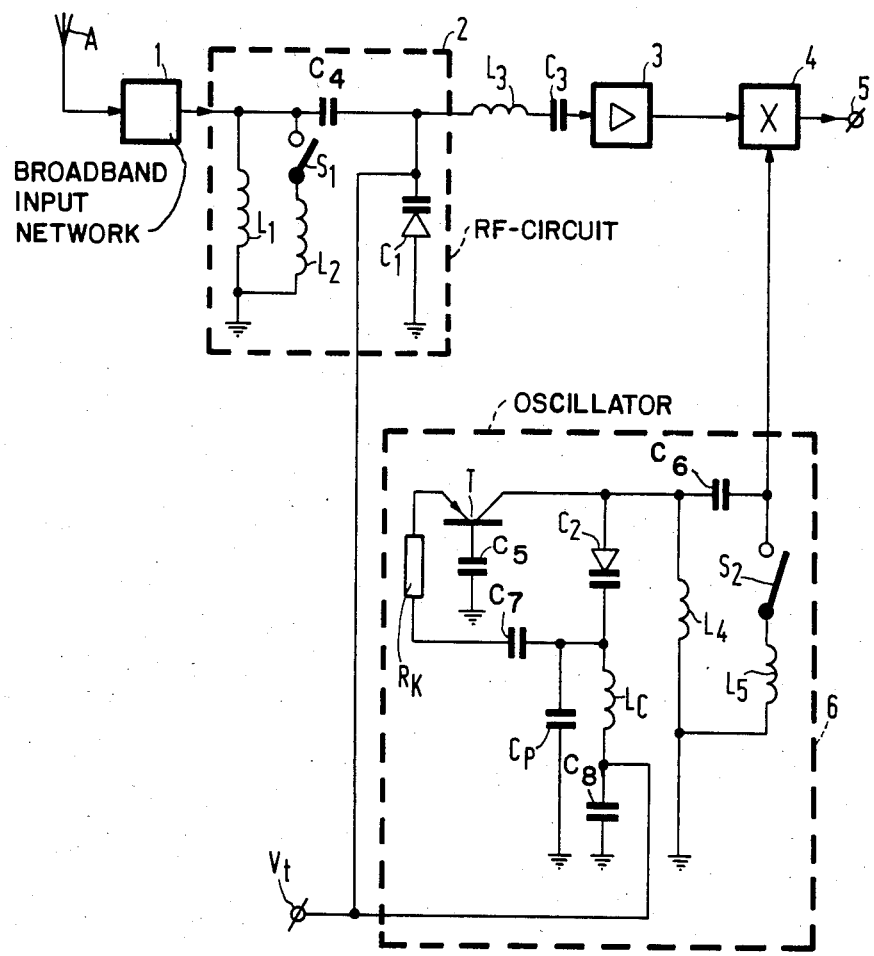
FIG. 1 shows a tuning arrangement according to the invention.

FIG. 1 shows a tuning arrangement according to the invention from which, for the sake of clarity, the measures for biasing the circuits have been omitted and in which coupling capacitors which have no signal function but have, for example, only for their object to block the tuning voltage, are denoted by $C_k$. The tuning arrangement comprises, coupled one after the other to an aerial A: a broadband input network 1, a tunable RF-circuit 2, a coupling filter $L_3C_3$, a selective amplifier stage 3 which may comprise one or more tunable circuits, not shown, and a mixer stage 4. Oscillator signals are applied from an a mixer stage 4. Oscillator signals are applied from an oscillator circuit 6 to the mixer stage 4 which converts to a fixed intermediate frequency the RF-signal which is selected by the RF-circuit 2 and the selective amplifier stage 3 and applied to the mixer stage 5, the resulting IF-signal being available at an output 5.

The RF-circuit 2 comprises a parallel LC-resonant network $L_1$, $L_2$, $C_1$ having a grounded inductance $L_1$ in the inductive branch, in parallel with which an inductance $L_2$ can be switched, using a switch $S_1$ which in practice is a switching diode, and having in the capacitive branch a variable capacitance diode $C_1$ whose anode is coupled to ground and whose cathode is coupled to the inductance $L_1$ via a coupling capacitor $C_4$. A variable tuning voltage $V_{tun}$ is applied to the diode $C_1$ from a tuning voltage input $V_t$.

Figure 1A:
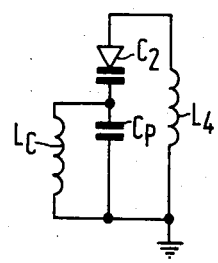
FIG. 1A illustrates the oscillator resonant circuit of the tuning arrangement of FIG. 1.

The oscillator 6 comprises an oscillator transistor T whose base is connected to ground via a coupling capacitor $C_5$ and whose collector is coupled to a resonant circuit $C_2$, $C_P$, $L_4$, $L_5$, $L_C$ and also to the mixer stage 4 via a coupling capacitor $C_6$. The resonant circuit $C_2$, $C_P$, $L_4$, $L_C$ is shown for alternating current in FIG. 1A and comprises two parallel branches, one branch of which includes a grounded inductance $L_4$, in parallel with which (see FIG. 1) an inductance $L_5$ can be arranged also by means of a switch $S_2$ in the form of a switching diode, and whose other branch comprises a series arrangement of a variable capacitance diode $C_2$ and a grounded padding capacitor $C_P$. The padding capacitor $C_P$ is shunted by a coil $L_C$ grounded through coupling capacitor $C_8$. The junction between the diode $C_2$ and the padding capacitor $C_p$ is coupled, for a regenerative feedback of the oscillator 6, via a coupling capacitor $C_7$ and a coupling resistor $R_K$ to the emitter of the oscillator transistor T. In this situation, the cathode of the diode $C_2$ faces said junction, to which the same tuning voltage $V_{tun}$ is applied as to the cathode of the diode $C_1$ from the tuning voltage input $V_t$ via the coil $L_C$.

The tuning arrangement described so far, the coil $L_C$ excepted, corresponds to the above-mentioned known TV-tuning arrangement ELC 2006 and is suitable for tuning to a desired TV-signal in inter alia the low-VHF-band which, in addition to the standardized VHF I-band (48.25–62.25 MHz), also includes the frequency range above this standardized VHF I-band to 105.25 MHz, and, after closure of the switches $S_1$ and $S_2$, for tuning to a desired TV-signal in the high VHF-band (112.25–294.25 MHz) in accordance with the CCIR system standard B. The frequency of the TV-signal selected by the RF-circuit 2 and the selective amplifier stage 3 is converted in the mixer stage 4 to a fixed intermediate frequency of 38.9 MHz and the tuning frequency of the oscillator resonant circuit 6 is then predominantly located by a frequency value of the order of magnitude of 40 MHz above the tuning frequency of the RF-circuit 2. A variation of the tuning over both bands is effected by varying the tuning voltage $V_{tun}$ in each of these VHF-frequency bands over predominantly the same tuning voltage range (approximately 1 to 28 V). This causes the capacitances of the two diodes $C_1$ and $C_2$ to vary in each of the two VHF-frequency bands also through a mutually predominantly equal capacitance range (approximately from 40 to 3 pF). As is known, the diode capacitances then vary in a direction opposite to the direction of the tuning voltage and the tuning frequency.

So as to utilize the useful diode capacitance variation range optimally, the diode in the circuit having the lower tuning frequency, i.e. $C_1$ in the RF-circuit 2, predominantly determines the circuit capacitance. This results in a certain length of the tuning frequency range and a certain variation in the tuning slope therein, which deviate from those of the oscillator circuit 6 having the higher tuning frequency. A certain reduction in these deviations, more specifically for tuning the high VHF-frequency band, is obtained with the aid of the padding capacitor $C_P$, which reduces the relative variation of the circuit capacitance and consequently the tuning slope of the oscillator resonant circuit.

If, however, in the known tuning arrangement, the padding capacitor is chosen to have an adequately high value to ensure acceptable tracking at the high frequency end of the tuning range (for example at the top of the high VHF-frequency band), then, in practice, it appears that in the lower portion of the tuning range, more specifically in said low VHF-band, the tuning frequency of the oscillator resonant circuit 6 gets undesirably close to the tuning frequency of the RF circuit 2, at a decreasing frequency.

In order to prevent, at least at the high frequency end of the low-VHF frequency band, too large a reduction in the difference between the circuit tuning frequencies, the padding capacitor $C_P$ in the known tuning arrangement is given a lower value at the transition of tuning from the lowest tuning frequency (112.5 MHz) of the high VHF-band to the highest tuning frequency (105.25 MHz) of the low VHF-band, by arranging an additional circuit capacitance (not shown) in parallel therewith. However, this requires a switching diode (not shown). The switching current of such a switching diode can hardly be prevented from flowing through the circuit and will consequently produce hum and/or other low-frequency noise voltages across the variable capacitance diode $C_2$. This low-frequency noise voltage may be impermissibly large and may result in a disturbing frequency modulation of the oscillator signal.

If, in contrast therewith, the padding capacitor $C_P$ is chosen to have an adequately low value to ensure acceptable tracking in the low VHF-frequency band then, when tuning is effected in the high VHF frequency band, the tuning frequency of the oscillator resonant circuit 6, has been found to remove itself undesirably far from the tuning frequency of the RF circuit 2, at an increasing frequency.

In addition, the choice of the value of the padding capacitor $C_P$ is limited by the required mutual matching of the sizes of the tuning ranges of the two circuits.

In the shown tuning arrangement according to the invention, the padding capacitor $C_P$ was chosen, as it was also in the prior art tuning arrangement, to have an adequately high value to provide satisfactory tracking at the high frequency end of the tuning range, that is to say in said high VHF frequency band and, at a decreasing tuning frequency, an increasing reduction occurs, in contrast with what occurs in the known tuning arrangement, on the apparent or the effective capacitance of the tuning capacitor $C_P$ because of the effect of the coil $L_C$. As a result thereof, the reducing effect of the padding capacitor $C_P$ on the tuning slope at a decreasing frequency is further intensified. This coil $L_C$ is chosen such that the resonant frequency determined by the coil $L_C$ and the padding capacitor $C_P$ decreases to below the lowest frequency in the tuning range of the oscillator resonant circuit 6. In this tuning range, the reduction in the apparent capacitance of the padding capacitor $C_P$ varies, as is known, predominantly in proportion to the square of, the quotient of on the one hand, the tuning frequency of the oscillator resonant circuit 6 and, on the other hand, to the last-mentioned resonant frequency determined by $L_C$ and $C_P$. By an appropriate choice of this resonant frequency relative to the tuning frequency ranges of the two circuits, it is not only ensured that acceptable tracking over the overall VHF-tuning range becomes possible but, by means of the coil, the oscillator frequency is, at the same time, prevented from resonating below the lowest permissible tuning frequency, at the lowest tuning voltage occurring, that is to say the highest capacitance value of the capacitance diode $C_2$.

In a practical embodiment of a tuning arrangement according to the invention the components used had the following values:

| Capacitor: | Value: | Coils: | Value: |
|---|---|---|---|
| $C_P$ | 120 pF | $L_1$ | 190 nH |
|  |  | $L_2$ | 40 nH |
|  |  | $L_3$ | 100–400 nH |
|  |  | $L_4$ | 160 nH |
|  |  | $L_5$ | 40 nH |
|  |  | $L_C$ | 70 nH |

The variable capacitors $C_1$ and $C_2$ are constituted by variable capacitance diodes of the type BB909B, which have a variation in capacitance from 3 to 40 pF in a tuning voltage variation range from 28 to 1 V.

It will be obvious that in a tuning direction in which the oscillator resonant circuit 6 has a frequency which is below the RF-circuit 2, using the measures according to the invention is made possible by constructing the circuit capacitance of the RF-circuit 2 similar to the capacitance of the oscillator resonant circuit 6 shown, and vice versa. In addition, it will be obvious that the invention is not limited to TV tuning arrangements and/or to the use of voltage-controlled variable capacitance diodes, but is, for example, alternatively usable in circuits which are tunable by means of jointly operated variable capacitors in, for example, radio tuning arrangements.

Figure 2A:
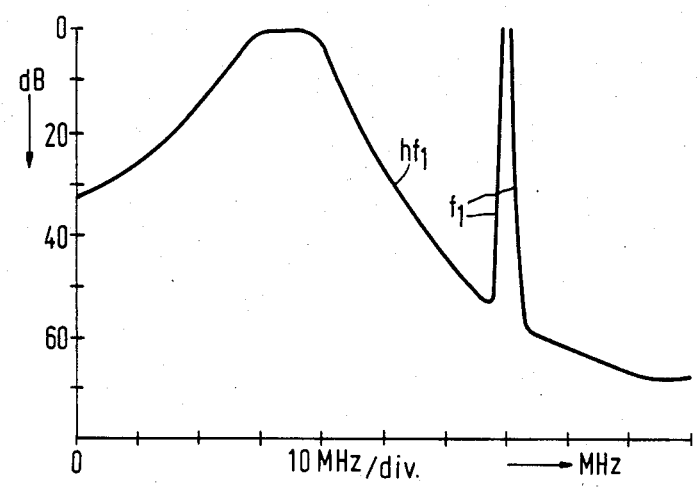
FIGS 2A–C show the effect of the coil on the location of the resonant frequency of the oscillator resonant circuit for three tuning frequencies.
Figure 2B:
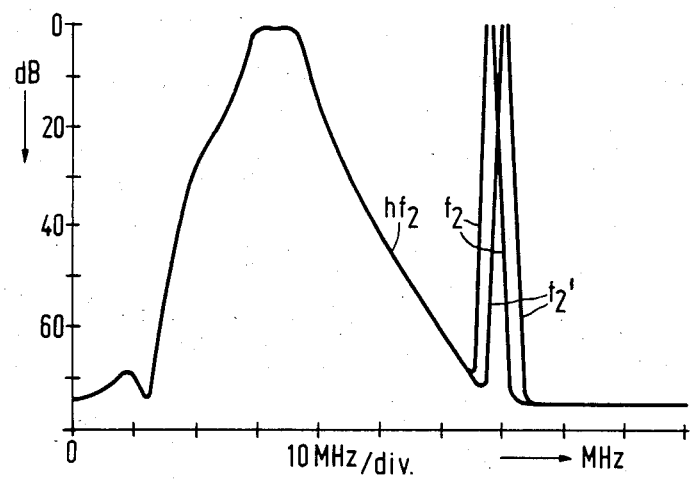
Figure 2C:
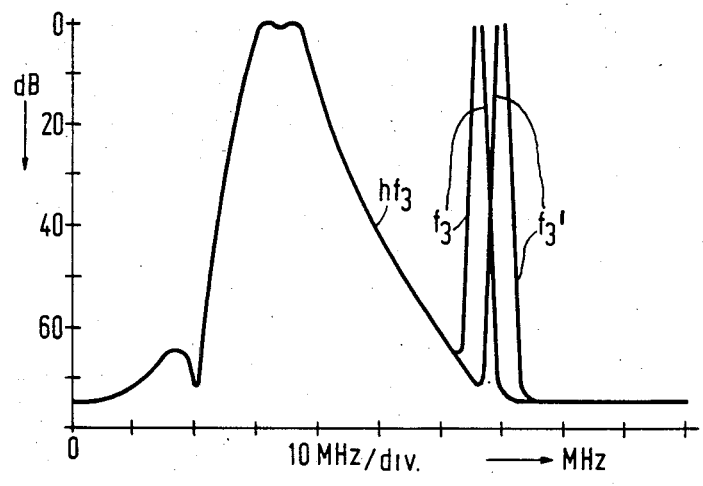

FIGS. 2A to 2C illustrate, by means of the curves $hf_1$ to $hf_3$, respectively, the shape and the location of the overall frequency characteristic of the RF-circuit 2 and the selective amplifier stage 3 as used in the tuning arrangement shown in FIG. 1 at the respective tuning frequencies 105.25 MHz, 55.25 MHz and 48.25 MHz. Curves $f_1$ to $f_3$ illustrate the shape and the location of the frequency characteristic of the oscillator resonant circuit (not shown) without the coil $L_C$ and curves $f_2'$ to $f_3'$ illustrate the shape and the location of the frequency characteristic of the oscillator resonant circuit when it comprises the coil $L_C$, as is shown in FIG. 1, at the same respective tuning frequencies as mentioned above.

At the highest tuning frequency of 105.25 MHz in the low VHF-band, the effect of the coil $L_C$ is so small as to be disregarded and, at an increasing frequency, is expressed in a growing increase of the resonant frequency of the oscillator resonant circuit 6. On the one hand, this achieves that the frequency spacing between the selected RF picture carrier and the oscillator frequency in the overall frequency range of the low VHF-band is substantially constantly 38.9 MHz. On the other hand, this results, for a certain frequency decrease at lower frequencies, in a larger decrease in the tuning voltage $V_{tun}$ being necessary than for higher frequencies. A decrease in the tuning frequency to below the lowest frequency (48.25 MHz) of the low VHF-band consequently requires such a high reduction in the tuning voltage $V_{tun}$, that the lower limit of the control range of this tuning voltage $V_{tun}$ is quickly reached, so that tuning to an impermissible tuning frequency is prevented.

I claim:

1. A tuning arrangement comprising a mixer stage, a tunable RF-circuit coupled to an input of the mixer stage, an oscillator circuit, coupled to another input of said mixer stage, having a tunable resonant circuit, and means, coupled to said RF- and oscillator circuits, for tuning said circuits to mutually different resonant frequencies, of which at least one of said circuits, having a highest of said resonant frequencies, comprises a parallel arrangement of a circuit inductance and a series arrangement of a tuning capacitor and a padding capacitor, characterized in that in said one circuit, the padding capacitor is shunted by a coil, which reduces the effect of the capacitance of the padding capacitor within the tuning range of said one circuit, and the resonant frequency determined by the coil and the padding capacitor is located below a lowest tuning frequency of said one circuit.

2. A tuning arrangement as claimed in claim 1, characterized in that said one circuit having the highest resonant frequency is the resonant circuit of the oscillator circuit, and the coil limits the tuning range of said resonant circuit at a low frequency end thereof.

3. A tuning arrangement as claimed in claim 1 or 2, characterized in that the tuning range of the tuning arrangement comprises at least the standardized television frequency band VHF I and that the resonant frequency of the oscillator resonant circuit is located an order of magnitude of 40 MHz above the resonant frequency of the RF-circuit, the padding capacitor being of the order of magnitude of 120 pF and the coil being of the order of magnitude of 70 nH.

* * * * *